United States Patent [19]

Mueller et al.

[11] Patent Number: 4,856,037
[45] Date of Patent: Aug. 8, 1989

[54] ARRANGEMENT FOR EXPOSING SEMICONDUCTOR WAFERS BY MEANS OF A SYNCHROTRON RADIATION IN LITHOGRAPHIC EQUIPMENT

[75] Inventors: Karl-Heinz Mueller; Hans Betz, both of Berlin; Wilhelm Vach, Hallbergmoos; Johann Krenner, Berglern, all of Fed. Rep. of Germany

[73] Assignees: Siemens Aktiengesellschaft; Karl Suess KG GmbH & Co.; Frauenhofer Gesellschaft, all of Berlin and Munich, Fed. Rep. of Germany

[21] Appl. No.: 73,435

[22] Filed: Jul. 15, 1987

[30] Foreign Application Priority Data

Jul. 15, 1986 [DE] Fed. Rep. of Germany ....... 3623875

[51] Int. Cl.⁴ .............................................. G21K 5/10
[52] U.S. Cl. .................................. 378/34; 250/492.1; 250/492.2
[58] Field of Search .................. 378/34, 205, 206; 250/492.1, 492.2, 491.1

[56] References Cited

U.S. PATENT DOCUMENTS 4,238,780  12/1980  Doemens .................. 340/146.3 H
4,253,112   2/1981  Doemens ...................... 358/101

OTHER PUBLICATIONS

Müller "Overlay Measurements for X-ray Lithography" *J. Vac. Sci. Technol. B.*, vol. 3, No. 1, Jan./Feb. 1985, pp. 2141-244.

Folchi et al "X-ray Lithography Mask Alignment Stage", IBM Techn. Discl. Bull. vol. 25, No. 12, May 1983, pp. 6400-6401.

*Primary Examiner*—Carolyn E. Fields
*Assistant Examiner*—David P. Porta
*Attorney, Agent, or Firm*—Hill, Van Santen, Steadman & Simpson

[57] ABSTRACT

An arrangement or apparatus for exposing semiconductor wafers by means of a synchrotron radiation, wherein a mask and semiconductor wafer are movable in a common, perpendicular direction relative to the direction of the X-ray beam in order to sweep an exposure field. The optical devices are provided for observing adjustment marks on the mask and semiconductor wafer to create control signals for the adjustment of the mask and wafer relative to each other. The beam radiation is conducted in a tube having a rectangular slot-shaped radiation window, which is arranged immediately adjacent to the mask and the optical devices are provided next to the beam feed tube and aligned to a part of the exposure fields lying outside of the impingement area of the beam leaving the radiation window.

20 Claims, 2 Drawing Sheets

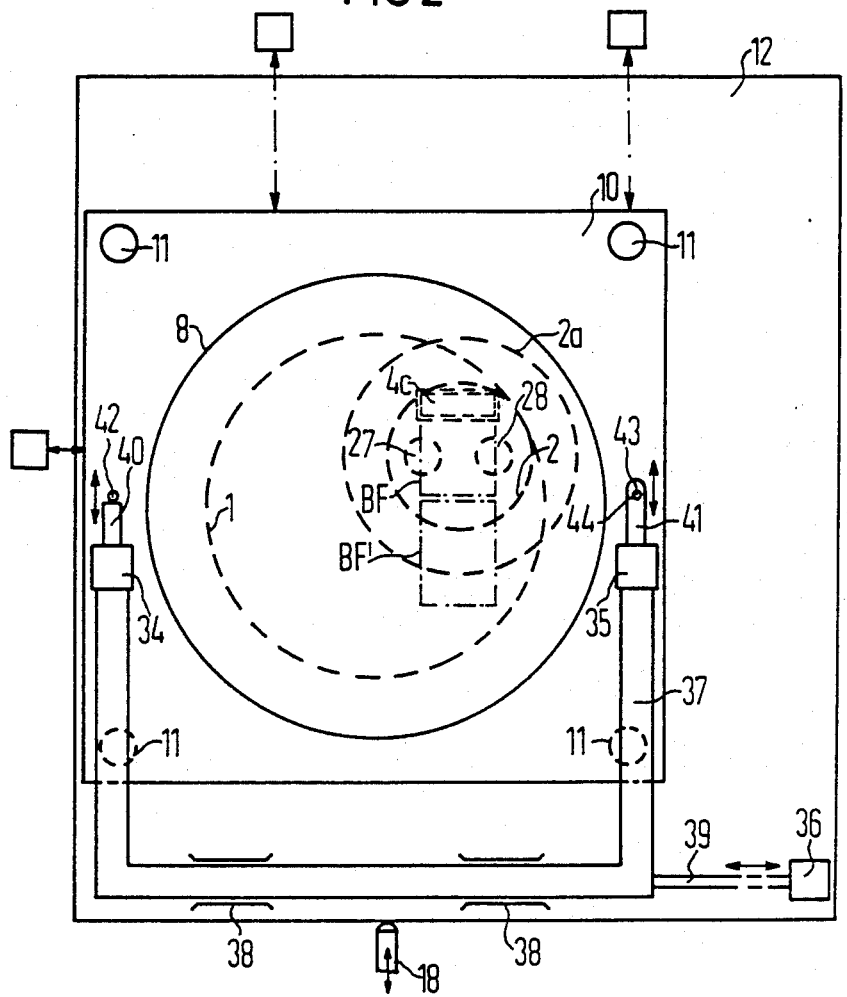

ARRANGEMENT FOR EXPOSING SEMICONDUCTOR WAFERS BY MEANS OF A SYNCHROTRON RADIATION IN LITHOGRAPHIC EQUIPMENT

BACKGROUND OF THE INVENTION

The present invention is directed to an arrangement for exposing semiconductor wafers with synchroton radiation in a lithography equipment, wherein parallel X-rays are guided in a beam tube through a radiation window and impinge on a structured mask and then on a semiconductor wafer to be structured, the mask and the semiconductor wafer are movable in a common plane perpendicular to the direction of radiation in order to sweep an exposure field, which is larger than the impinged area of the X-ray beam defined by the radiation window, and adjustment marks are provided on the mask and on the semiconductor wafer, which are examined by optical devices and are utilized to create control signals for controlling the movement of the mask and semiconductor wafer relative to each other.

An arrangement of this type was disclosed in an article by K. H. Mueller entitled "*Overlay Measurements for X-ray Lithography*", J. Vac. Sci. Technol. B., Vol. 3, No. 1, Jan/Feb. 1985, pp. 241–244. The radiation window is provided in a wall of an exposure chamber in which either a vacuum or a helium atmosphere of about 50 mbar are built up in order to lead the X-ray beam to the mask and semiconductor combination, which is arranged in the exposure chamber spaced from the window, in a loss-free of fashion as possible. Observation of the adjustment marks applied to the mask and to the semiconductor wafer occurs via a microscope comprising two objectives, which are arranged in the exposure chamber and are pivotable around a stationary axis between the window and mask.

For the purpose of mutual adjustment of the mask and semiconductor wafer, the objectives are pivoted into a working position, which is between the radiation window and the mask, and has the objectives being immediately proceeding a mask in the direction of radiation and aligned with the adjustment marks thereon. After the adjustment, they can be pivoted out of the working position so that the X-ray can have unimpeded access. The exposure of the mask/semiconductor wafer combination then occurs, wherein the latter, in its adjusted position is moved through the beam perpendicular to the beam direction in order to sweep an exposure field, which is larger than the impinging area of the X-ray defined by the radiation window. Given this arrangement, it is necessary to open the exposure chamber when replacing the exposed semiconductor wafer with one to be subsequently exposed or when replacing the employed mask with another mask. After each opening of the exposure chamber, the vacuum or the helium atmosphere must then be reintroduced in order to continue the exposure procedure, and this makes the exposure procedure lengthy and involved. In addition, the objectives of the microscope must be pivoted into the working position for every adjustment procedure and must, in turn, be pivoted out again before the beginning of the following exposure, and this pivoting of the objectives increases the operating outlay and cost.

SUMMARY OF THE INVENTION

The object of the present invention is to provide an arrangement for exposing semiconductor wafers with a synchrotron radiation in lithographic equipment, wherein parallel X-rays are guided in a beam feed tube and emerge from a radiation window and impinge on a structured mask and the semiconductor wafer to be structured, wherein the above-mentioned difficulties do not occur. To accomplish these goals, the present invention is directed to an improvement in an arrangement or apparatus having a parallel X-ray guided in a beam feed tube for emerging from a radiation window and impinging on a structured mask and semiconductor laser, one after another, means for mounting the mask and semiconductor wafer to be movable in common perpendicular to the radiation direction in order to sweep an exposure field which is larger than the impingement area of the X-ray being defined by the radiation window and optical devices for interpreting adjustment marks on both the mask and the semiconductor wafer to create control signals for positioning the mask and wafer relative to each other. The improvements are that the radiation window of the beam feed tube is fashioned slot-like, said tube extends toward the mask to stationarily position the window immediately in front of the mask and the optical devices are provided next to the beam feed tube and are aligned to a part of the mask lying outside of the impingement area during the adjustment.

The arrangement of the invention is particularly distinguished in that a faster exposure of the semiconductor wafer can be carried out than what would occur in the case of a comparable traditional arrangement, because the exposure chamber, which is either evacuated or charged with the helium atmosphere, is eliminated. This advantage is intensified for the exposure of a semiconductor wafer, which comprises a plurality of exposure fields, as well as for the exposure of a series of semiconductor wafers, each of which is to be structured with the respectively same mask.

Other features and improvements are that the mounting means for the mask and semiconductor hold the mask and semiconductor on a table, which is movable in common perpendicular to the beam direction and that the mask is arranged in a recess or opening of this table, or is arranged offset thereto either opposite the radiation direction or in the radiation direction. The optical devices are stationarily arranged partially within the opening of this table. The means for mounting a semiconductor wafer allows movement of the semiconductor wafer relative to the mask and perpendicular to the radiation direction in order to achieve a sequential radiation of a pluarality of exposure fields. Preferably, the means for mounting the semiconductor wafer is mounted on a back side of the table, while the means for mounting the mask is provided on a front side of the table, as seen in the direction of radiation.

The invention shall be set forth hereinbelow in greater detail, wherein other objects and advantages will be readily apparent from the following description of the preferred embodiments, the drawings and claims.

BRIEF DESCRIPTION OF THE DRAWINGS

FIG. 2 is an end view of the apparatus of FIG. 1.

DESCRIPTION OF THE PREFERRED EMBODIMENTS

Figure 1:
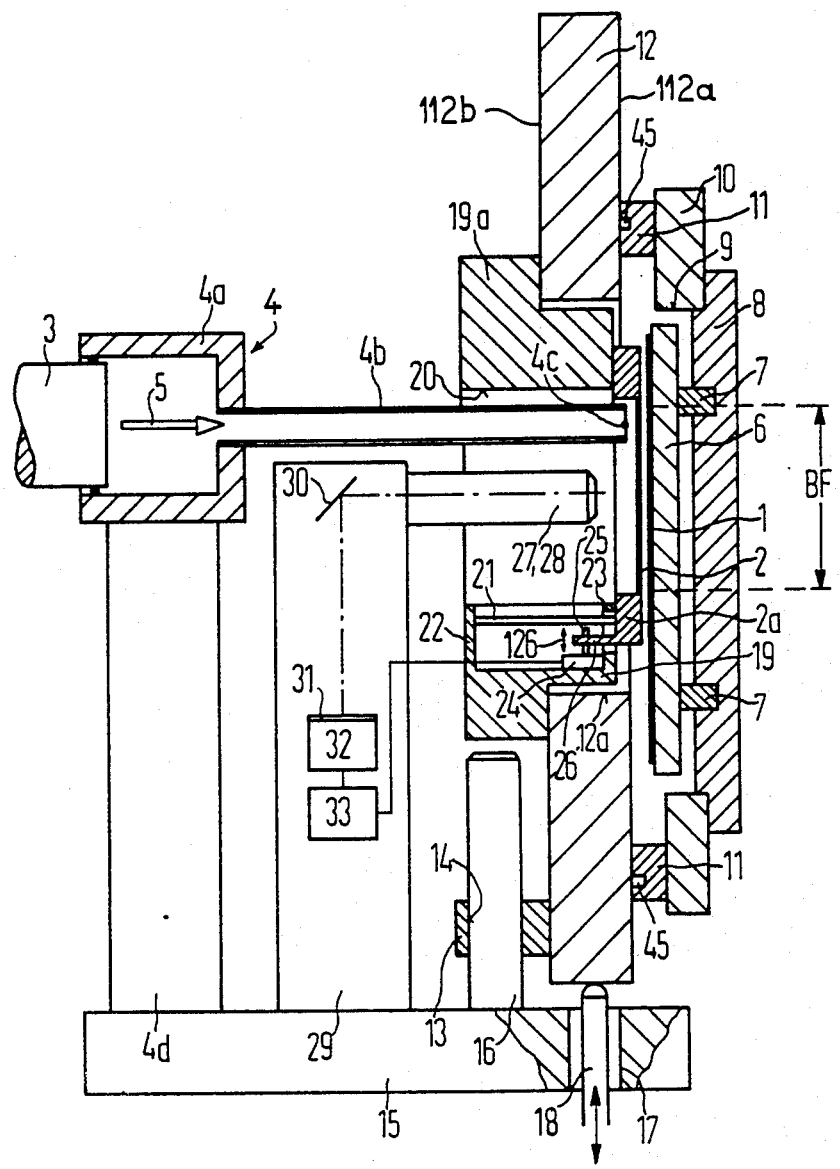
FIG. 1 is a schematic cross sectional view of an apparatus in accordance with the present invention.

The principles of the present invention are particularly useful in lithographic equipment comprising an apparatus for exposure of a semiconductor wafer 1, which is to be structured upon employment of a structured mask 2, held at a prescribed distance relative to it, as illustrated in FIG. 1. The structuring of the wafer 1 occurs by means of a sychrotron radiation supplied via a tube 3. The sychrotron radiation is preferably X-radiation having a high parallelism, which is expediently coupled out of a storage ring of an electron accelerator. The tube 3 is followed by a beam guide, generally indicated at 4, which is composed of a cylindrical part 4a, secured to a column 4d, that is mounted on a base 15 of the apparatus. The beam guide 4 has a projection or tube 4b having a rectangular cross section, which determinates an irradiation window 4c. The x-radiation guided in the parts 3 and the beam guide 4 moves in a direction, which is indicated by the arrow 5. The dimensions of the parts 4b and 4c, which is measured perpendicular to the plane of FIG. 1, is dimensioned larger than the dimensions measured in a vertical direction so that the cross section of the tube 4b and the window 4c is a band-shaped cross section of an X-ray beam supplied via 3, as illustrated by the indication of the window 4c in FIG. 2. For example, the height of the rectangular cross section can amount to 8 mm, while the width is 40 mm.

A semiconductor wafer 1 is secured to a retaining plate 6, which is, in turn, attached to an insertion plate 8 by connecting elements 7. The insertion plate 8 is inserted into a recess or opening 9 of a table or stage 10 and is rigidly connected thereto. The stage 10 is, in turn, provided with spacer elements 11, which hold it at a prescribed distance from a back surface 112a of a table 12. The table 12 is situated in a plane that is perpendicular to the radiation direction 5 and is displaceable in a vertical direction in this plane. To accomplish the displacement in a vertical direction, the table 12 has a projection 13, which is provided with a bore 14, which slidably receives a pin 16 secured to the bottom plate 15. A pin 18, which projects through an opening 17 in the bottom plate 15 is movable in a longitudinal direction by a drive means (not shown), as indicated by the double arrow to displace the table 12. Thus, the wafer 1 connected to the table 12 by the parts 6–11 is displaced in a perpendicular plane to the radiation direction 5.

The mask 2, which has a reinforced edge 2a to form a frame is secured on a mask mount 19. The mask mount 19 has an opening or a recess 20, which is covered by the mask 2. The mask mount 19 is secured to a front side or surface 112b of the table 12, as seen in the radiation direction, and is secured thereto by means of a flange-like part or first portion 19a, with a second portion projecting into the recess or opening 12a of the table 12. The mask 2 is, thus, also situated within the opening 12a or, respectively, in a position which is axially offset thereto in a radiation direction 5. An offset opposite the radiation direction 5 would be just as possible. The mask mount 19, in addition, is fashioned so that the mask 2 is displaceable in parallel in two different directions in a plane lying perpendicular to the radiation direction 5 and is also rotatable in this plane. In detail, the mask 2 is connected to a part 22, which partially extends into the opening 20. The mask is connected by three pins, of which only the pin 21 is illustrated in FIG. 1, and the pins project through clearances, for example, 23 in the mask mount 19. The relative movement between the mask 2 and the mount 19 is effected with three adjustment mechanisms, particularly piezo-electric adjustment mechanisms, such as 24, whose adjustment pin 25 acts on a projection 26 in the direction of a double arrow 126. The relative movement between the parts 2 and 19 can be produced by three adjustment mechanisms 24 which act on two projections 26. A mask mount constructed in this fashion is already known and disclosed in an article by G. A. Folchi et al entitled "X-ray Lithography Mask Alignment Stage", *IBM Techn. Discl. Bull.*, Vol. 25, No. 12, May 1983, pp. 6400–6401.

The mutual adjustment of the semiconductor wafer 1 and of the mask 2 occurs with the assistance of at least two optical devices, for example, 27, 28, which lie side-by-side so that only one of them, for example 27 is illustrated in FIG. 1, however, both are illustrated in FIG. 2 by the broken lines. What is to be understood by these devices are that the two objectives of the microscope, which are preferably arranged on a column 29, will transmit the image of the adjustment marks to a mirror 30 which reflects them onto a picture screen 31 of a video pick-up means 32. The video pick-up means 32 will create an electrical signal, which is supplied to an electronic data processor 33. The processor 33 will produce control signals from the electrical signals, and these control signals are then supplied to the adjustment mechanism, such as 24. A fine adjustment of the position of the mask 2 relative to the semiconductor wafer 1, which is thereby to be conceived of as being stationary, occurs with the assistance of the setting signal so that a precise position matching of these two parts is achieved. The creation of the control signal and the utilization of the control signals to position the mask are known and disclosed in U.S. Pat. Nos. 4,238,780 and 4,253,112, whose disclosures are incorporated by reference thereto.

The radiation window 4c is situated immediately in front of the mask 2 when taken in the radiation direction, and is stationarily arranged within the recess or opening 20 or, respectively, in accordance with FIG. 1, within the edge zone or frame 2a of the mask 2. The optical devices 27 and 28 are thereby provided next to the beam feed tube 4b and, likewise, lie in the interior of the opening 20. When the part of the mask or, respectively, the semiconductor wafer lying opposite the radiation window 4c is referred to as an impinging area, then the optical devices 27 and 28 are aligned to such a part of the mask 2 which, given the relative position of the parts 1, 2 and 4, shown in FIG. 1, lie outside of the impinging area of the supplied X-radiation.

In order to expose the semiconductor wafer 1, one then proceeds so that it is first brought into such a position relative to the table 12 and, thus, relative to the mask 2 held thereon that a defined exposure field BF of the mask lies opposite the wafer. This occurs in a way set forth below with reference to FIG. 2. The adjustment marks of the semiconductor wafer and of the mask 2 are then situated in such tight proximity next to one another that their images are picked up via the optical devices 27 and 28, and can be transmitted to the picture screen 31. The control signals from the means 33 influence the adjustment mechanism 24 so that the precise, mutual adjustment of the parts 1 and 2 is guaranteed.

In the adjusted position, the table 12 and with it the semiconductor wafer 1 and the mask 2 are then moved vertically up on the basis of an upwardly directed movement of the setting pin 18 so that, given feed of a parallel X-ray beam 5, the impingement area is gradually shifted from top to bottom over the entire exposure field BF. This common movement of the parts 1 and 2 past the radiation window 4c can also be referred to as a "scan" motion. After the exposure of the exposure field BF, the semiconductor wafer 1 is then displaced relative to the table top 12 and, thus, relative to the mask 2 so that the mask lies opposite a new exposure field BF' (see FIG. 2). This adjustment can be interpreted as a "step" motion.

FIG. 2 is an end view taken from the right hand side of FIG. 1 and, thus, is opposite to the beam direction. As illustrated, the stage 10, in whose recess the insertion plate plate 8 is secured together with the semiconductor wafer, is movable relative to the table 12 on the basis of drive mechanisms 34, 35 and 36. Advantageously, the stage 10 is held between the table 12 and a U-shaped connecting link 37, which is mounted for horizontal displacement in guides 38, which are attached to the table 12. The drive of the connecting link 37 in the horizontal direction occurs by the pin 39, which is actuated by the drive mechanism 36, which is secured to the table 12. The drive mechanisms 34 and 35 are secured to leg portions of the U-shaped link 37. The mechanism 34 has a pin 40, which engages a pin 42 secured to the table 10, while the mechanism 35 has a pin 41 having a bore 44 to receive a pin 43 which is secured to the table 12. The pins 39, 40 and 41 are each movable in both directions, as indicated by the double arrows. The "step" motion is generated by the mechanisms 34, 35 and 36 so that the semiconductor wafer 1 is set to various exposure fields, such as BF or BF', with relation to the mask 2. The optical devices 27 and 28 will serve for fine adjustment of the mask and the semiconductor wafer.

The spacer elements 11, which are secured to the stage 10, are preferably provided with vacuum controlled suction devices, which are indicated by grooves or channels 45 in FIG. 1. By building up the vacuum in the groove 45, the table 12 and the stage 10 are thereby clamped to one another. This is carried out after the semiconductor wafer 1 has been set to a predetermined exposure field, for example, BF lying opposite the mask 2. Such a movement or positioning of the wafer to present the exposure field BF to the mask occurs through the mechanisms 34, 35 and 36 and before the mutual adjustments of the parts 1 and 2 with the adjustment mechanism 24.

Although various minor modifications may be suggested by those versed in the art, it should be understood that we wish to embody within the scope of the patent granted hereon all such modifications as reasonably and properly come within the scope of our contribution to the art.

We claim:

1. In an apparatus for exposing semiconductor wafers by means of a synchrotron radiation in lithographic equipment, wherein parallel X-rays are guided in a beam feed tube to emerge from a radiation window and impinge on a structured mask and then from the structured mask to a semiconductor wafer to be structured, said apparatus having means for mounting the mask and semiconductor wafer for movement together in a plane perpendicular to the radiation direction in order to sweep an exposure field which is larger than the area of the radiation window and means for adjusting the mask relative to the semiconductor wafer including optical devices for observing alignment adjustment marks on both the mask and wafer to create control signals, for controlling the movement of actuators to create relative movement between the mask and semicondcutor wafer, the improvements comprising the radiation window having a rectangular slot-like configuration, said beam feed tube extending up to adjacent the mask to stationarily arrange the window immediately in front of said mask and said optical devices being stationarily provided next to the beam feed tube and being aligned to a part of the mask lying outside of an X-ray impingement area during a step of adjustment.

2. In an apparatus according to claim 1, wherein the means for mounting the mask and semiconductor wafer includes a table having an opening, means for moving the table in a plane perpendicular to the direction of the beam of radiation, said mask being positioned on the axis of said opening of the table in said opening.

3. In an apparatus according to claim 2, wherein the optical devices are stationarily arranged to extend into said opening adjacent the beam feed tube.

4. In an apparatus according to claim 2, wherein the means for mounting further includes a stage supporting the semiconductor wafer, means mounting the stage on said table for movement relative to the table and in a plane extending perpendicular to the beam direction in order to achieve a sequential irradiation of a plurality of exposure fields of said mask.

5. In an apparatus according to claim 4, wherein the means for mounting the stage mounts the stage on a back side of the table when taken in the direction of radiation.

6. In an apparatus according to claim 2, which means for mounting includes a mask mount, said mask mount having a first portion attached to a front side of the table and a second portion extending into the opening in said table, said second portion supporting the mask in said opening.

7. In an apparatus according to claim 1, wherein the means for mounting the semiconductor wafer and mask includes a table having an opening, and means for mounting the mask on an axis of the opening and axially offset from said opening.

8. In an apparatus according to claim 7, wherein the optical devices are stationarily arranged with a portion extending into said opening of the table.

9. In an apparatus according to claim 7, wherein the means for mounting includes a stage supporting the semiconductor wafer, means for mounting the stage on the table for relative movement to the table in a plane perpendicular to the direction of radiation so that the wafer can be shifted to present different exposure fields relative to said mask.

10. In an apparatus according to claim 9, wherein said means for mounting the stage mounts the stage on a back side of the table, as seen in the direction of radiation from the beam of radiation.

11. In an apparatus according to claim 7, wherein the means for mounting the mask includes a mask mount having a first portion received on a front surface of the table with a second portion extending into said opening to position said mask on the axis of said opening.

12. In an apparatus for exposing semiconductor wafers by means of a synchrotron radiation in lithographic equipment, wherein parallel X-rays are guided in a beam feed tube to emerge from a radiation window and impinge on a structured mask and then from the structured mask to a semiconductor wafer to be structured, said apparatus having means for mounting the mask and semiconductor wafer for movement together in a plane perpendicular to the radiation direction in order to sweep an exposure field which is larger than the area of the radiation window and means for adjusting the mask relative to the semiconductor wafer including optical devices for observing alignment adjustment marks on both the mask and wafer to create control signals for controlling the movement of actuators to create relative movement between the mask and semiconductor wafer, the improvements comprising said apparatus being free of an exposure chamber for its mask and wafer, the radiation window having a rectangular slot-like configuration, said beam feed tube extending up to adjacent the mask to stationarily arrange the window immediately in front of said mask and said optical devices being stationarily provided next to the beam feed tube and being aligned to a part of the mask lying outside of an impingement area of the X-rays during a step of adjustment.

13. In an apparatus according to claim 12, wherein the means for mounting the mask and semiconductor wafer includes a table having an opening, means for moving the table in a plane perpendicular to the direction of the beam of radiation, said mask being positioned on the axis of said opening of the table in said opening.

14. In an apparatus according to claim 13, wherein the optical devices extend into said opening adjacent the beam feed tube.

15. In an apparatus according to claim 13, wherein the means for mounting further includes a stage supporting the semiconductor wafer, means mounting the stage on said table for movement relative to the table and in a plane extending perpendicular to the beam direction in order to achieve a sequential irradiation of a plurality of exposure field of said mask.

16. In an apparatus according to claim 15, wherein the means for mounting the stage mounts the stage on a back side of the table when taken in the direction of radiation.

17. In an apparatus according to claim 13, which means for mounting includes a mask mount, said mask mount having a first portion attached to a front side of the table and a second portion extending into the opening in said table, said second portion supporting the mask in said opening.

18. In an apparatus according to claim 12, wherein the means for mounting the semiconductor wafer and mask includes a table having an opening and means for mounting the mask on an axis of the opening and axially offset from said opening, and the optical devices have a portion extending into said opening of the axis.

19. In an apparatus according to claim 18, wherein the means for mounting includes a stage supporting the semiconductor wafer, means for mounting the stage of the table for relative movement to the table in a plane perpendicular to the direction of radiation so that the wafer can be shifted to present different exposure fields relative to said mask.

20. In an apparatus according to claim 19, wherein said means for mounting the stage mounts the stage on a back side of the table, as seen in the direction of radiation from the beam of radiation.

* * * * *